US011830852B2

(12) United States Patent
Liebmann et al.

(10) Patent No.: US 11,830,852 B2
(45) Date of Patent: Nov. 28, 2023

(54) MULTI-TIER BACKSIDE POWER DELIVERY NETWORK FOR DENSE GATE-ON-GATE 3D LOGIC

(71) Applicant: TOKYO ELECTRON LIMITED, Tokyo (JP)

(72) Inventors: Lars Liebmann, Mechanicsville, NY (US); Jeffrey Smith, Clifton Park, NY (US); Daniel Chanemougame, Niskayuna, NY (US); Paul Gutwin, Williston, VT (US); Brian Cline, Austin, TX (US); Xiaoqing Xu, Austin, TX (US); David Pietromonaco, San Jose, CA (US)

(73) Assignee: TOKYO ELECTRON LIMITED, Tokyo (JP)

( * ) Notice: Subject to any disclaimer, the term of this patent is extended or adjusted under 35 U.S.C. 154(b) by 199 days.

(21) Appl. No.: 17/541,581

(22) Filed: Dec. 3, 2021

(65) Prior Publication Data

US 2022/0181300 A1 Jun. 9, 2022

Related U.S. Application Data

(60) Provisional application No. 63/121,599, filed on Dec. 4, 2020.

(51) Int. Cl.
*H01L 25/00* (2006.01)
*H01L 25/065* (2023.01)
*H01L 25/18* (2023.01)
*H01L 23/528* (2006.01)

(52) U.S. Cl.
CPC .......... *H01L 25/0657* (2013.01); *H01L 25/50* (2013.01); *H01L 23/5286* (2013.01); *H01L 25/18* (2013.01); *H01L 2225/06544* (2013.01)

(58) Field of Classification Search
CPC . H01L 25/0657; H01L 25/50; H01L 23/5286; H01L 23/481; H01L 25/105; H01L 2225/1047
See application file for complete search history.

(56) References Cited

U.S. PATENT DOCUMENTS

| 2020/0161204 A1* | 5/2020 | Kim | H01L 23/49838 |
| 2020/0168537 A1* | 5/2020 | Bae | H01L 23/49838 |
| 2020/0303314 A1* | 9/2020 | Kang | H01L 23/5386 |
| 2022/0181263 A1* | 6/2022 | Liebmann | H01L 21/76898 |

(Continued)

*Primary Examiner* — Thao P Le
(74) *Attorney, Agent, or Firm* — Oblon, McClelland, Maier & Neustadt, L.L.P.

(57) ABSTRACT

Aspects of the present disclosure provide a multi-tier semiconductor structure. For example, the multi-tier semiconductor structure can include a first power delivery network (PDN) structure, and a first semiconductor device tier disposed over and electrically connected to the first PDN structure. The multi-tier semiconductor structure can further include a signal wiring tier disposed over and electrically connected to the first semiconductor device tier, a second semiconductor device tier disposed over and electrically connected to the signal wiring tier, and a second PDN structure disposed over and electrically connected to the second semiconductor device tier. The multi-tier semiconductor structure can further include a through-silicon via (TSV) structure electrically connected to the signal wiring tier, wherein the TSV structure penetrates the second PDN structure.

20 Claims, 2 Drawing Sheets

(56) References Cited

U.S. PATENT DOCUMENTS

| | | | |
|---|---|---|---|
| 2023/0107492 A1* | 4/2023 | Song | H01L 23/544 257/797 |
| 2023/0154894 A1* | 5/2023 | Hwang | H01L 24/05 257/621 |
| 2023/0230901 A1* | 7/2023 | Farooq | H01L 23/5286 257/774 |

* cited by examiner

MULTI-TIER BACKSIDE POWER DELIVERY NETWORK FOR DENSE GATE-ON-GATE 3D LOGIC

INCORPORATION BY REFERENCE

This present disclosure claims the benefit of U.S. Provisional Application No. 63/121,599, entitled "Multi-Tier Backside Power Delivery Network for Dense Gate-on-Gate 3D Logic Integration" filed on Dec. 4, 2020, which is incorporated herein by reference in its entirety.

FIELD OF THE PRESENT DISCLOSURE

The present disclosure relates generally to microelectronic devices including semiconductor devices, transistors, and integrated circuits, including methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, which has enabled the integration of heterogeneous functional circuits, such as logic and memory circuits, onto the same semiconductor substrate. However, 2D scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other as another means of further scaling of integrated circuits (ICs).

SUMMARY

Aspects of the present disclosure provide a multi-tier semiconductor structure. For example, the multi-tier semiconductor structure can include a first power delivery network (PDN) structure, and a first semiconductor device tier disposed over and electrically connected to the first PDN structure. The multi-tier semiconductor structure can further include a signal wiring tier disposed over and electrically connected to the first semiconductor device tier, a second semiconductor device tier disposed over and electrically connected to the signal wiring tier, and a second PDN structure disposed over and electrically connected to the second semiconductor device tier. The multi-tier semiconductor structure can further include a through-silicon via (TSV) structure electrically connected to the signal wiring tier, wherein the TSV structure penetrates the second PDN structure. For example, the TSV structure can include a plurality of TSVs vertically stacked over one another. As another example, the TSV structure can be disposed within a boundary region of the multi-tier semiconductor structure.

In an embodiment, the TSV structure can further penetrate the first PDN structure. In another embodiment, the signal wiring tier can include multiple wiring levels. In some other embodiments, the first semiconductor device tier can include multiple first semiconductor devices that are vertically stacked over one another.

In another embodiment, the multi-tier semiconductor structure further includes another first semiconductor device tier disposed over and electrically connected to the second PDN structure, another signal wiring tier disposed over and electrically connected to the another first semiconductor device tier, another second semiconductor device tier disposed over and electrically connected to the another signal wiring tier, another second PDN structure disposed over and electrically connected to the another second semiconductor device tier, and another TSV structure electrically connected to the another signal wiring tier, the another TSV structure penetrating at least one of the another first PDN structure and the another second PDN structure.

In an embodiment, the multi-tier semiconductor structure can further include a first substrate disposed between the first semiconductor device tier and the first PDN structure, and a first power rail buried in the first substrate, the first power rail electrically connecting the first PDN structure to the first semiconductor device tier. In another embodiment, the multi-tier semiconductor structure can further include a third PDN structure disposed over the second PDN structure and electrically connected to the TSV structure.

Aspects of the present disclosure provide a method for fabricating a multi-tier semiconductor structure. For example, the method can include providing a first PDN structure, and disposing a first semiconductor device tier over the first PDN structure and electrically connecting the first semiconductor device tier to the first PDN structure. The method can further include disposing a signal wiring tier over the first semiconductor device tier and electrically connecting the signal wiring tier to the first semiconductor device tier. The method can further include disposing a second semiconductor device tier over the signal wiring tier and electrically connecting the second semiconductor device tier to the signal wiring tier. The method can further include disposing a second PDN structure over the second semiconductor device tier and electrically connecting the second PDN structure to the second semiconductor device tier. The method can further include forming a TSV structure that electrically connects the signal wiring tier and penetrates the second PDN structure. For example, the TSV structure can include a plurality of TSVs vertically stacked over one another. As another example, the TSV structure can be disposed within a boundary region of the multi-tier semiconductor structure.

In an embodiment, the TSV structure can further penetrate the first PDN structure. In another embodiment, the first semiconductor device tier can include multiple first semiconductor devices that are vertically stacked over one another. For example, the first semiconductor devices can include gate-all-around (GAA) semiconductor devices that are vertically stacked over one another.

In an embodiment, the signal wiring tier can include multiple wiring levels. For example, electrically connecting the signal wiring tier to the first semiconductor device tier can include electrically connecting at least one of the wiring levels of the signal wiring tier to the first semiconductor device tier, and electrically connecting the second semiconductor device tier to the signal wiring tier can include electrically connecting the second semiconductor device tier to a remainder of the wiring levels of the signal wiring tier and bonding the remainder of the wiring levels to the at least one of the wiring levels. In another embodiment, the multi-tier semiconductor structure can be fabricated by sequential 3D integration.

In an embodiment, the method can further include disposing a first substrate between the first semiconductor device tier and the first PDN structure, and burying a first power rail in the first substrate, the first power rail electrically connecting the first PDN structure to the first semiconductor device tier.

In an embodiment, the first semiconductor device tier can include multiple first semiconductor devices that are vertically stacked over one another. For example, the first semiconductor devices can include GAA semiconductor devices that are vertically stacked over one another.

In an embodiment, the method can further include disposing a third PDN structure over the second PDN structure and electrically connecting the third PDN structure to the TSV structure.

Note that this summary section does not specify every embodiment and/or incrementally novel aspect of the present disclosure or claimed disclosure. Instead, this summary only provides a preliminary discussion of different embodiments and corresponding points of novelty over conventional techniques. For additional details and/or possible perspectives of the present disclosure and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION

The word "exemplary" is used herein to mean, "serving as an example, instance or illustration." Any embodiment of construction, process, design, technique, etc., designated herein as exemplary is not necessarily to be construed as preferred or advantageous over other such embodiments. Particular quality or fitness of the examples indicated herein as exemplary is neither intended nor should be inferred.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the apparatus (or device) in use or operation in addition to the orientation depicted in the figures. The apparatus (or device) may be otherwise oriented (rotated 90 degrees or at other orientations) and the spatially relative descriptors used herein may likewise be interpreted accordingly.

The present disclosure includes a novel micro-architecture that enables efficient and compact integration of CMOS logic and memory into dense, multi-tier blocks. 3D integration, i.e., the vertical stacking of multiple tiers of logic and memory, aims to overcome scaling limitations experienced in conventional two dimensional VLSI by offering the integrated circuit design, e.g., place and route tool, an additional degree of freedom in reducing wire-length across critical paths. 3D integration (3Di) techniques herein are particularly applicable to a 3D fabrication formation known as gate-on-gate (GoG) 3Di. In GoG 3Di two or more semiconductor device tiers of silicon are sequentially fabricated, e.g., deposited, grown and bonded, onto the primary substrate. This bonding of silicon or wafers enables the vertical stacking of logic and memory cells with dense connectivity at a resolution limited only by lithography, instead of wafer or chip bonding alignment tolerances.

One aspect of dense GoG 3Di that is challenging is the power-delivery across multiple functional semiconductor device tiers. Increasing the volumetric density of transistors without providing for an adequate power delivery network (PDN) would prove counterproductive. Techniques herein provide a micro-architecture that integrates a multi-tier PDN while providing for dense tier-to-tier signal connectivity.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Figure 1:
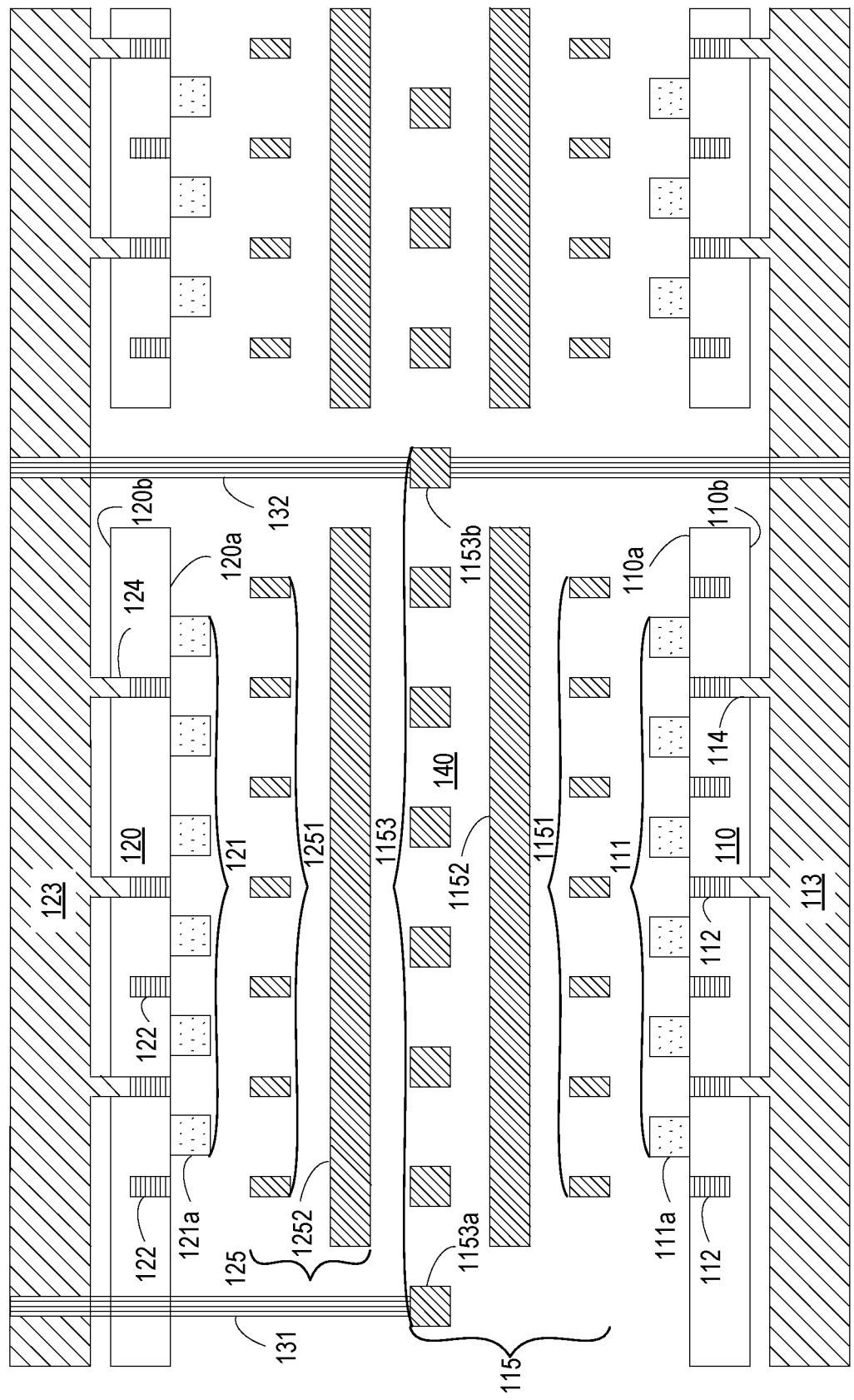
FIG. 1 shows a simplified cross-sectional view of an exemplary multi-tier semiconductor structure in accordance with some embodiments of the present disclosure.

FIG. 1 shows a simplified cross-sectional view of an exemplary multi-tier semiconductor structure 100, which illustrates a double backside power delivery network (PDN) to dedicate an inter-tier gap entirely to dense a signal wiring tier, in accordance with some embodiments of the present disclosure. A first substrate (or a wafer) 110, e.g., a silicon or SiGe substrate, can be provided. A first (or lower) semiconductor device tier 111 can be disposed on the first substrate 110. For example, the first semiconductor device tier 111 can be disposed on a front side 110a of the first substrate 110. The first semiconductor device tier 111 can include one or more first (or lower) semiconductor devices 111a, such as field effect transistors (FETs), that form a functional circuit, such as a logic circuit or a memory circuit. Further, these FETs can be n-type or p-type FETs that are arranged along the front side 110a or stacked vertically over one another along the thickness direction of the first substrate 110. In an embodiment, the first semiconductor devices 111a can include gate-all-around (GAA) semiconductor devices that are vertically stacked over one another. In another embodiment, the first semiconductor devices 111a can include FinFETs that are vertically stacked over one another One or more first (or lower) power rails 112 can be buried in the first substrate 110 and electrically connect the first semiconductor device tier 111 to a first (or lower) power delivery network (PDN) structure 113 by way of first through-silicon vias (TSVs) (e.g., nano-scale) 114 to provide, one, two or more than two voltages, e.g., low voltage (Vss) and high voltage (VDD) power delivery, for example, from the first PDN structure 113 to the first semiconductor device tier 111. In an embodiment, the first PDN structure 113 can be disposed on a back side 110b of the first substrate 110. In another embodiment, the first PDN structure 113 can include a PDN wire or plate.

A first (or lower) signal wiring structure (or a first wiring tier) 115 can be disposed over the first semiconductor device tier 111 and used to electrically connect the first semiconductor device tier 111 to, for example, another semiconductor device tier (e.g., a second semiconductor device tier 121, which will be described later) disposed over the first signal wiring structure 115. The first signal wiring structure 115 can include one or more wiring layers (or wiring levels), with each wiring layer including one or more wiring tracks that extend in a direction along the front side 110a of the first substrate 110. Generally, wiring tracks in one wiring layer will run in a direction perpendicular to the direction of wiring tracks in an adjacent wiring layer. For example, the first signal wiring structure 115 can include three wiring layers 1151 to 1153, and the wiring layer 1151 can include seven wiring tracks that extend in a direction (e.g., perpendicular to the plane of the drawing page) perpendicular to the direction of wiring tracks in the wiring layer 1152 along the front side 110a of the first substrate 110.

A second (or upper) signal wiring structure (or a second wiring tier) 125 can be disposed over and electrically connected to the first signal wiring structure 115. The second signal wiring structure 125 also can include one or more wiring layers (or wiring levels), with each wiring layer including one or more wiring tracks that extend in a direction along the front side 110a of the first substrate 110. For example, the second signal wiring structure 125 can include two wiring layers 1251 and 1252, and the wiring layer 1251 can include seven wiring tracks that extend in a direction (e.g., perpendicular to the plane of the drawing page) perpendicular to the direction of wiring tracks in the wiring layer 1252 along the front side 110a of the first substrate 110.

In an embodiment, the first signal wiring structure 115 and the second signal wiring structure 125 can be collectively referred to as a signal wiring tier.

A second substrate (or a wafer) 120, e.g., a silicon or SiGe substrate, can be disposed over the signal wiring tier. A second (or upper) semiconductor device tier 121 can be disposed on the second substrate 120. For example, the second semiconductor device tier 121 can be disposed on a front side 120a of the second substrate 120. The second semiconductor device tier 121 can include one or more first (or lower) semiconductor devices 121a, such as field effect transistors (FETs), that form a functional circuit, such as a logic circuit or a memory circuit. Further, these FETs can be n-type or p-type FETs that are arranged along the front side 120a or stacked vertically over one another along the thickness direction of the second substrate 120. In an embodiment, the second semiconductor devices 121a can include lateral GAA semiconductor devices that are vertically stacked over one another.

One or more second (or upper) power rails 122 can be buried in the second substrate 120 and electrically connect the second semiconductor device tier 121 to a second (or upper) PDN structure 123 by way of second TSVs (e.g., nano-scale) 124 to provide low voltage (Vss) and high voltage (VDD) power delivery, for example, from the second PDN structure 123 to the second semiconductor device tier 121. In an embodiment, the second PDN structure 123 can be disposed on a back side 120b of the second substrate 120. In another embodiment, the second PDN structure 123 can include a PDN wire or plate.

In an embodiment, the first semiconductor device tier 111 and the second semiconductor device tier 121 can be separated by an inter-tier gap 140, which is filled with the signal wiring tier (i.e., the first signal wiring structure 115 and the second signal wiring structure 125).

The semiconductor structure 100 can further include one or more TSV structures. For example, the semiconductor structure 100 can include a first TSV structure 131 and a second TSV structure 132. Each of the first TSV structure 131 and the second TSV structure 132 can be electrically connected to the signal wiring tier. For example, the first TSV structure 131 and the second TSV structure 132 can be electrically connected to wiring tracks 1153a and 1153b of the wiring layer 1153 of the first signal wiring structure 115 of the signal wiring tier, respectively. The first and second TSV structures 131 and 132 of the semiconductor structure 100 can penetrate one or both of the first and second PDN structures 113 and 123 and electrically connect global wiring or other wiring structures disposed over the second PDN structure 123 and/or below the first PDN structure 113. For example, the first TSV structure 131 can penetrate the second PDN structure 123 and electrically connect a third PDN structure (not shown) disposed over the second PDN structure 123. As another example, the second TSV structure 132 can penetrate the first PDN structure 113 and the second PDN structure 123 as well. In an embodiment, the third PDN structure can be a global PDN structure, and the first TSV structure 131 and the second TSV structure 132 can have a large dimension accordingly.

In an embodiment, the first and second TSV structures 113 and 123 can be disposed within an under-used area of the semiconductor structure 100. For example, the first and second TSV structures 113 and 123 can be disposed within a boundary region of the semiconductor structure 100. In an embodiment, at least one of the first and second TSV structures 131 and 132 can include a plurality of TSVs vertically stacked over one another. In another embodiment, at least one of the first and second TSV structures 131 and 132 can include a single TSV (or a tier-to-tier via).

In the example embodiment shown in FIG. 1, the semiconductor structure 100 includes one pair of semiconductor device tiers (i.e., the first semiconductor device tier 111 and the second semiconductor device tier 121). In another embodiment, the semiconductor structure 100 can include more pairs of semiconductor device tiers, which can be disposed between the first and second PDN structures 113 and 123.

In an embodiment, the first PDN structure 113 (and the second PDN structure 123) and the first semiconductor device tier 111 (and the second semiconductor device tier 121) can be fabricated in a front-end-of-line (FEOL) level, the first power rails 112 (and the second power rails 122) can be fabricated in a middle-of-line (MOL) level, and the first signal wiring structure 115 (and the second signal wiring structure 125) can be fabricated in a back-end-of-line (BEOL) level. Then, the first signal wiring structure 115 and the second signal wiring structure 125 can be bonded to each other, to fabricate the semiconductor structure 100 in a face-to-face bonding. The bonding processing can include hybrid bonding, which loosely refers to any alternative to thermocompression bonding that combines metal interconnect with some other form of bonding. The hybrid bonding can include adhesive, or involve various interconnect metals such as copper (Cu), indium (In) and silver (Ag). The upper tier (including the first semiconductor device tier 111, the first substrate 110, the first power rails 112, the first signal wiring structure 115 and the first PDN structure 113) and the lower tier (including the second semiconductor device tier 121, the second substrate 120, the second power rails 122, the second signal wiring structure 125 and the second PDN structure 123) can be bonded in a wafer-to-wafer or die-to-wafer hybrid bonding manner. For example, the upper tier can include a plurality of chiplets (dies), which may be of different sizes, these dies can be transferred to a carrier wafer first, then the carrier wafer can be bonded to the lower tier, and finally the carrier wafer can be removed. As another example, the dies of the upper tier can be transferred to the lower tier individually using a pick-and-place flip-chip bonder.

In another embodiment, the semiconductor structure 100 can be fabricated by sequential 3D integration (3Di) (also referred to by some as monolithic 3Di), to achieve overlay tolerances compatible with dense inter-tier wiring. This monolithic 3Di involves sequentially fabricating multiple semiconductor device levels (e.g., the upper tier and the lower tier) one after the other on the same substrate. There is only one substrate, hence no need for aligning, thinning, bonding, or TSVs that may be used in hybrid, back-to-back or face-to-face bonding. For example, in CoolCube™, which is a sequential 3Di process pioneered by CEA-Leti (more information can be found at https://en.wikipedia.org/wiki/Three-dimensional_integrated_circuit), the lower tier can be built at a thermal budget reaching 1,000° C., then an silicon-on-insulator (SoI) layer can be bonded to the top of the lower tier, and finally the upper tier can be built over the lower tier at another thermal budget less than 600° C., e.g., 500° C., which is far lower than 1,000° C. This lower thermal budget can ensure that the performance of the lower tier is not degraded while the upper tier is fabricated and the intrinsic performance of the upper tier is not reduced. A major advantage of this sequential 3Di process is the near perfect alignment of the upper tier to the existing lower tier. By utilizing dense sequential 3Di, inter-tier connectivity can be maintained at the smallest metal pitch supported by the technology node's patterning and process capability. To that end, the signal wiring tier (e.g., the first signal wiring structure 115 and the second signal wiring structure 125) in the inter-tier gap 140 can be optimized for efficient lateral and vertical connectivity without having to fan-out to the significantly larger pitches needed for wafer or chip bonding 3Di approaches. A minor increase in the siring dimensions in the most central signal wiring tier is preferred to reduce resistance on longer lateral connections.

The split PDN arrangement (i.e., the first PDN structure 113 and the second PDN structure 123 being separated from each other and arranged on the back sides 110b of the first substrate 110 and the back side 120b of the second substrate 120, respectively) of the semiconductor structure 100 can ensure that the inter-tier gap 140 can be optimally utilized for the signal wiring tier with dimensions and aspect ratio optimized for efficient signal wiring. The two back-side PDNs (i.e., the first PDN structure 113 and the second PDN structure 123) can be optionally tied to a common global PDN structure with a TSV structure (which can have a large dimension) penetrating the semiconductor device stack (e.g., the first semiconductor device tier 111 and the second semiconductor device tier 121) in under-used area of the floorplan, such as macro or block boundaries.

In an embodiment, two or more of the multi-tier semiconductor structures 100 can be stacked on one another. For example, another first PDN structure (e.g., the first PDN structure 113) can be disposed on the second PDN structure 123, another first semiconductor device tier (e.g., the first semiconductor device tier 111) can be disposed over and electrically connected to the another first PDN structure, another signal wiring tier (e.g., the signal wiring tier (including the first signal wiring structure 115 and the second signal wiring structure 125)) can be disposed over and electrically connected to the another first semiconductor device tier, another second semiconductor device tier (e.g., the second semiconductor device tier 121) can be disposed over and electrically connected to the another signal wiring tier, another second PDN structure (e.g., the second PDN structure 123) can be disposed over and electrically connected to the another second semiconductor device tier, and another TSV structure (e.g., the first TSV structure 131 and the second TSV structure 132) can be electrically connected to the another signal wiring tier, the another TSV structure penetrating at least one of the another first PDN structure and the another second PDN structure.

Figure 2:
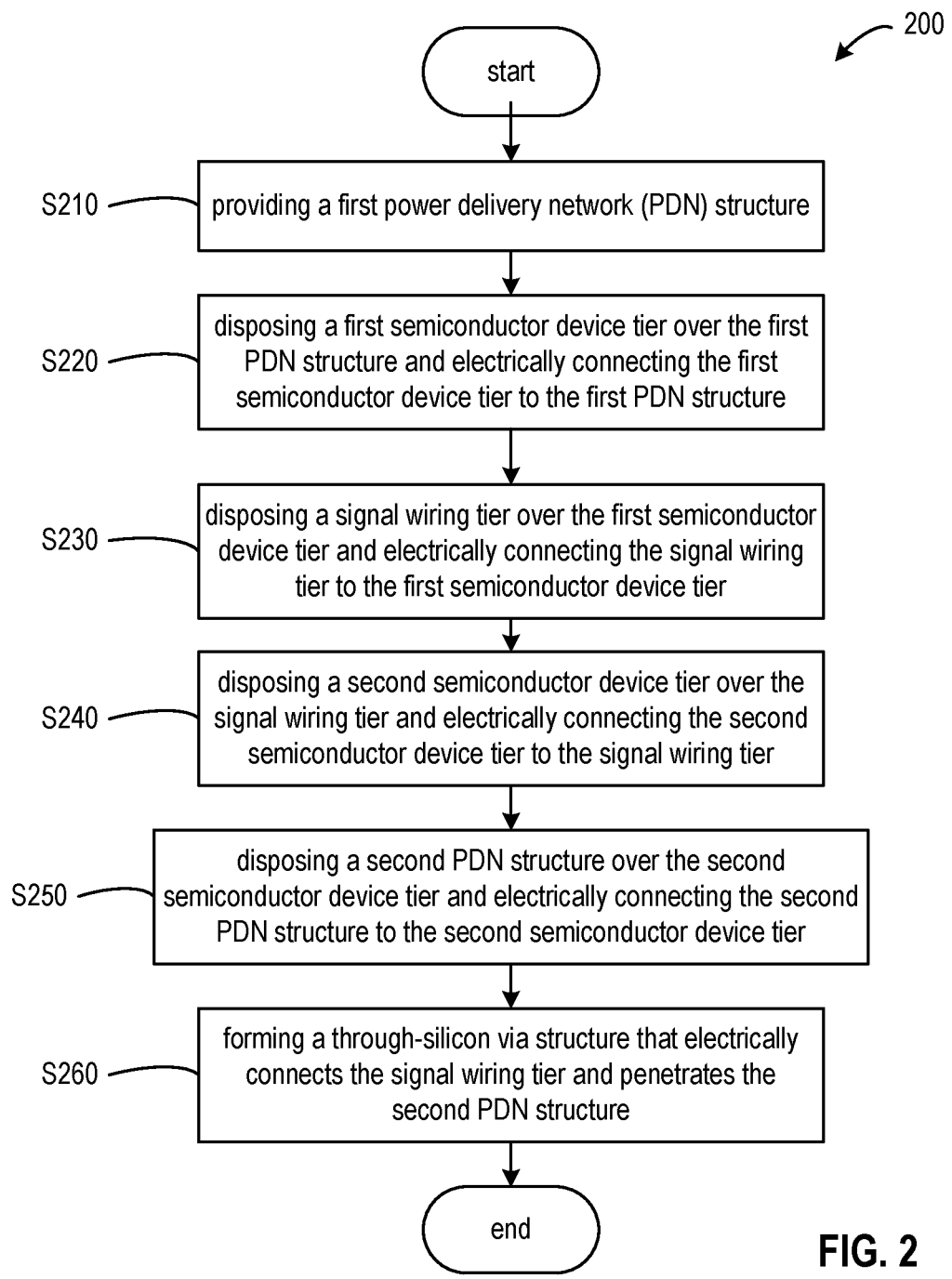
FIG. 2 is a flow chart illustrating an exemplary method of fabricating a multi-tier semiconductor structure in accordance with some embodiments of the present disclosure.

FIG. 2 is a flow chart illustrating an exemplary method 200 for fabricating a multi-tier semiconductor structure in accordance with some embodiments of the present disclosure. In an embodiment, some of the steps of the exemplary method 200 shown can be performed concurrently or in a different order than shown, can be substituted by other method steps, or can be omitted. Additional method steps can also be performed as desired. In another embodiment, the exemplary method 200 can correspond to the multi-tier semiconductor structure 100 of FIG. 1.

At step S210, a first PDN structure can be provided. For example, the first PDN structure 113 can be provided.

At step S220, a first semiconductor device tier can be disposed over and electrically connected to the first PDN structure. For example, the first semiconductor device tier 111 can be disposed over and electrically connected to the first PDN structure 113. The first semiconductor device tier can include multiple first semiconductor devices. For example, the first semiconductor device tier 111 can include the first semiconductor devices 111a.

At step S230, a signal wiring tier can be disposed over and electrically connected to the first semiconductor device tier. For example, the first signal wiring structure 115 and the second signal wiring structure 125, which can be collectively referred to as the signal wiring tier, can be disposed over and electrically connected to the first semiconductor device tier 111.

At step S240, a second semiconductor device tier can be disposed over and electrically connected to the signal wiring tier. For example, the second semiconductor device tier 121 can be disposed over and electrically connected to the signal wiring tier.

At step S250, a second PDN structure can be disposed over and electrically connected to the second semiconductor device tier. For example, the second PDN structure 123 can be disposed over and electrically connected to the second semiconductor device tier 121.

At step S260, a TSV structure can be formed to electrically connect the signal wiring tier and penetrate the second PDN structure. For example, the first TSV structure 131 can be formed to electrically connect the signal wiring tier and penetrate the second PDN structure 133. In an embodiment, the TSV structure can further penetrate the first PDN structure. For example, the second TSV structure 132 can penetrate the second PDN structure 133 and further penetrate the first PDN structure 113.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with some embodiments of the present disclosure. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the present disclosure. Such variations are intended to be covered by the scope of this disclosure. As such, the foregoing descriptions of embodiments of the present disclosure are not intended to be limiting. Rather, any limitations to embodiments of the present disclosure are presented in the following claims.

What is claimed is:

1. A multi-tier semiconductor structure, comprising:
    a first power delivery network (PDN) structure;
    a first semiconductor device tier disposed over and electrically connected to the first PDN structure;
    a signal wiring tier disposed over and electrically connected to the first semiconductor device tier;
    a second semiconductor device tier disposed over and electrically connected to the signal wiring tier;
    a second PDN structure disposed over and electrically connected to the second semiconductor device tier; and
    a through-silicon via (TSV) structure electrically connected to the signal wiring tier, the TSV structure penetrating the second PDN structure.

2. The multi-tier semiconductor structure of claim 1, wherein the TSV structure further penetrates the first PDN structure.

3. The multi-tier semiconductor structure of claim 1, wherein the signal wiring tier includes multiple wiring levels.

4. The multi-tier semiconductor structure of claim 1, wherein the TSV structure includes a plurality of TSVs vertically stacked over one another.

5. The multi-tier semiconductor structure of claim 1, wherein the TSV structure is disposed within a boundary region of the multi-tier semiconductor structure.

6. The multi-tier semiconductor structure of claim 1, further comprising:
    a first substrate disposed between the first semiconductor device tier and the first PDN structure; and
    a first power rail buried in the first substrate, the first power rail electrically connecting the first PDN structure to the first semiconductor device tier.

7. The multi-tier semiconductor structure of claim 1, wherein the first semiconductor device tier includes multiple first semiconductor devices that are vertically stacked over one another.

8. The multi-tier semiconductor structure of claim 1, further comprising:
    another first semiconductor device tier disposed over and electrically connected to the second PDN structure;
    another signal wiring tier disposed over and electrically connected to the another first semiconductor device tier;
    another second semiconductor device tier disposed over and electrically connected to the another signal wiring tier;
    another second PDN structure disposed over and electrically connected to the another second semiconductor device tier; and
    another TSV structure electrically connected to the another signal wiring tier, the another TSV structure penetrating at least one of the another first PDN structure and the another second PDN structure.

9. The multi-tier semiconductor structure of claim 1, further comprising a third PDN structure disposed over the second PDN structure and electrically connected to the TSV structure.

10. A method for fabricating a multi-tier semiconductor structure, the method comprising:
    providing a first PDN structure;
    disposing a first semiconductor device tier over the first PDN structure and electrically connecting the first semiconductor device tier to the first PDN structure;
    disposing a signal wiring tier over the first semiconductor device tier and electrically connecting the signal wiring tier to the first semiconductor device tier;
    disposing a second semiconductor device tier over the signal wiring tier and electrically connecting the second semiconductor device tier to the signal wiring tier;
    disposing a second PDN structure over the second semiconductor device tier and electrically connecting the second PDN structure to the second semiconductor device tier; and
    forming a TSV structure that electrically connects the signal wiring tier and penetrates the second PDN structure.

11. The method of claim 10, wherein the TSV structure further penetrates the first PDN structure.

12. The method of claim 10, wherein the signal wiring tier includes multiple wiring levels.

13. The method of claim 12, wherein:
    electrically connecting the signal wiring tier to the first semiconductor device tier includes electrically connecting at least one of the wiring levels of the signal wiring tier to the first semiconductor device tier; and
    electrically connecting the second semiconductor device tier to the signal wiring tier includes electrically connecting the second semiconductor device tier to a remainder of the wiring levels of the signal wiring tier and bonding the remainder of the wiring levels to the at least one of the wiring levels.

14. The method of claim 10, wherein the multi-tier semiconductor structure is fabricated by sequential 3D integration.

15. The method of claim 10, wherein the TSV structure includes a plurality of TSVs vertically stacked over one another.

16. The method of claim 10, wherein the TSV structure is disposed within a boundary region of the multi-tier semiconductor structure.

17. The method of claim 10, further comprising:
disposing a first substrate between the first semiconductor device tier and the first PDN structure; and
burying a first power rail in the first substrate, the first power rail electrically connecting the first PDN structure to the first semiconductor device tier.

18. The method of claim 10, wherein the first semiconductor device tier includes multiple first semiconductor devices that are vertically stacked over one another.

19. The method of claim 18, wherein the first semiconductor devices include lateral GAA semiconductor devices that are vertically stacked over one another.

20. The method of claim 10, further comprising disposing a third PDN structure over the second PDN structure and electrically connecting the third PDN structure to the TSV structure.

* * * * *

UNITED STATES PATENT AND TRADEMARK OFFICE
CERTIFICATE OF CORRECTION

PATENT NO. : 11,830,852 B2
APPLICATION NO. : 17/541581
DATED : November 28, 2023
INVENTOR(S) : Liebmann et al.

Page 1 of 1

It is certified that error appears in the above-identified patent and that said Letters Patent is hereby corrected as shown below:

On the Title Page

Column 1, Item (72), in "Inventors", Line 1, delete "Mechanicsville," and insert -- Mechanicville, --, therefor.

Signed and Sealed this
Twenty-sixth Day of November, 2024

Katherine Kelly Vidal
*Director of the United States Patent and Trademark Office*